(12) United States Patent
Ito (10) Patent No.: US 7,265,403 B2
(45) Date of Patent: Sep. 4, 2007

(54) SEMICONDUCTOR DEVICE (75) Inventor: Toyoji Ito, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 248 days.

(21) Appl. No.: 11/078,371

(22) Filed: Mar. 14, 2005

(65) Prior Publication Data
US 2005/0230779 A1 Oct. 20, 2005

(30) Foreign Application Priority Data
Mar. 30, 2004 (JP) ............................. 2004-098129

(51) Int. Cl.
H01L 29/76 (2006.01)
(52) U.S. Cl. ...................... 257/295; 257/296; 257/306; 257/E27.104
(58) Field of Classification Search ................ 257/295, 257/E27.104
See application file for complete search history.

(56) References Cited

U.S. PATENT DOCUMENTS

| 6,249,014 | B1* | 6/2001 | Bailey ........................ 257/295 |
| 6,455,882 | B1* | 9/2002 | Nakura ....................... 257/295 |
| 6,509,593 | B2* | 1/2003 | Inoue et al. ................. 257/295 |
| 6,759,703 | B1* | 7/2004 | Matsuhashi ................. 257/306 |
| 6,956,279 | B2* | 10/2005 | Song .......................... 257/533 |
| 2002/0127867 | A1* | 9/2002 | Lee ............................. 438/694 |
| 2004/0094791 | A1* | 5/2004 | Ito et al. ..................... 257/310 |
| 2004/0099893 | A1* | 5/2004 | Martin et al. ............... 257/295 |
| 2004/0206997 | A1* | 10/2004 | Mikawa et al. ............. 257/296 |
| 2004/0238870 | A1* | 12/2004 | Nakashima ................. 257/303 |
| 2006/0261387 | A1* | 11/2006 | Izumi ......................... 257/295 |

FOREIGN PATENT DOCUMENTS

| JP | 04-099386 | 3/1992 |
| JP | 11-126881 | 5/1999 |
| JP | 2001-237393 | 8/2001 |
| JP | 2003-068987 | 3/2003 |
| JP | 2003-068993 | 3/2003 |
| JP | 3621087 B | 11/2004 |

* cited by examiner

Primary Examiner—Jerome Jackson
Assistant Examiner—José R. Díaz
(74) Attorney, Agent, or Firm—McDermott Will & Emery LLP (57) ABSTRACT A semiconductor device is composed at least of a memory circuit part having capacitors and a peripheral circuit part for controlling the memory circuit part and has a first hydrogen barrier film of hydrogen resistance covering a region in which the capacitors are formed and a second hydrogen barrier film of hydrogen resistance covering at least the memory circuit part and the peripheral circuit part above the first hydrogen barrier film. The second hydrogen barrier film covers a region of the semiconductor device located between an interconnect layer above the first hydrogen barrier film and closest to the capacitors and the first hydrogen barrier film except for a region thereof in which a contact plug is formed.

29 Claims, 5 Drawing Sheets

SEMICONDUCTOR DEVICE

CROSS-REFERENCE TO RELATED APPLICATIONS

The disclosure of Japanese Patent Application No. 2004-98129 filed on Mar. 30, 2004 including specification, drawings and claims is incorporated herein by reference in its entirety.

BACKGROUND OF THE INVENTION (1) Field of the Invention

The present invention relates to a semiconductor device using a ferroelectric material or a high-dielectric-constant material for a capacitive insulating film.

(2) Description of Related Art

Semiconductor devices each using a ferroelectric material or a high-dielectric-constant material for a capacitive insulating film of a capacitor may be replaced with semiconductor devices each having a capacitive insulating film made of silicon oxide or silicon nitride in the field of non-volatile memory devices and dynamic random access memory (DRAM) devices. The reason for this is that ferroelectric materials and high-dielectric-constant materials exhibit residual polarization arising from hysteresis characteristics and have a high dielectric constant.

Typically, reduction action caused by hydrogen allows ferroelectric materials or high-dielectric-constant materials to have deteriorated characteristics, because ferroelectric materials or high-dielectric-constant materials are oxides whose crystal structures themselves determine their physical characteristics. In spite of this, a process of forming a MOS transistor, a process of forming a multilayer interconnect, a process of forming a protective film, and other processes include many process steps using not only a hydrogen gas but also a silane gas, a resist material and water (moisture) all containing hydrogen atoms.

Figure 5:
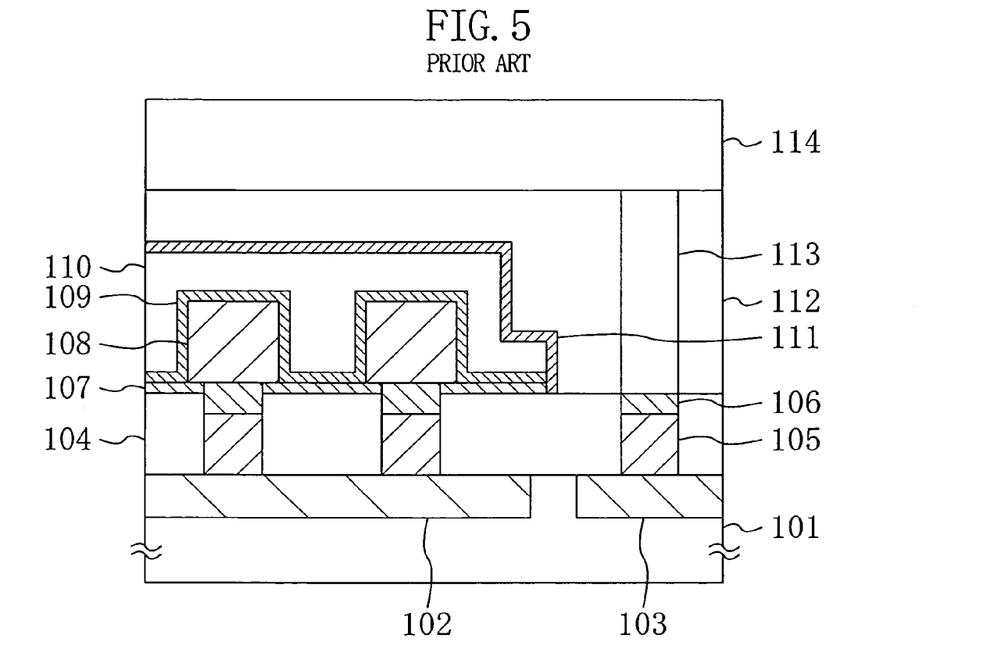
FIG. 5 is a cross-sectional view showing a semiconductor device according to a known example.
Figure 6:
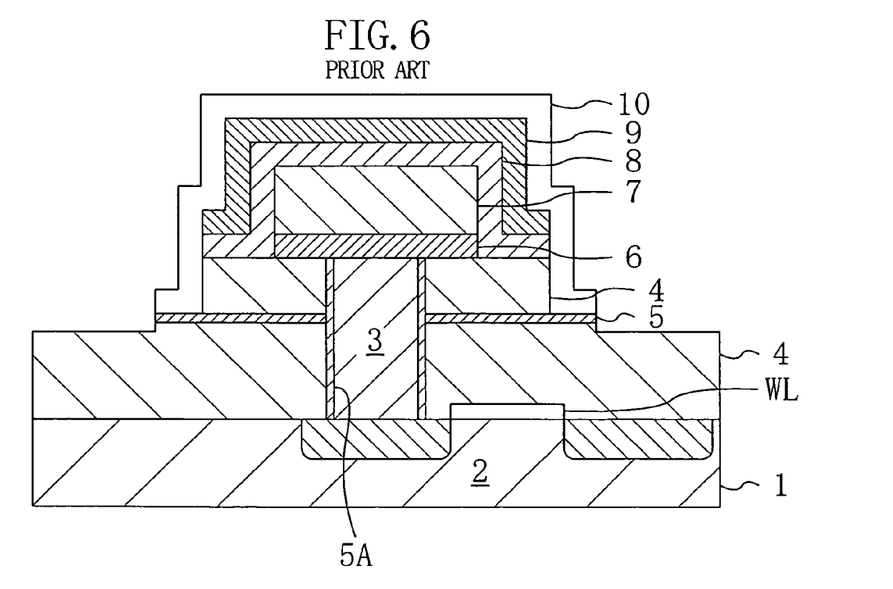
FIG. 6 is a cross-sectional view showing a semiconductor device according to another known example.

For example, Japanese Unexamined Patent Publications Nos. 11-126881 and 2001-237393 disclose as follows: as shown in FIGS. 5 and 6, in order to prevent a ferroelectric material or a high-dielectric-constant material from being deteriorated in its characteristics in each of production processes due to hydrogen, a ferroelectric capacitor is covered with hydrogen barrier films located above and below the ferroelectric capacitor; and the hydrogen barrier films are formed to enclose the ferroelectric capacitor therein.

SUMMARY OF THE INVENTION

The present inventor made various studies to further suppress, during a process of fabricating a semiconductor device including a capacitive insulating film made of a ferroelectric material, deterioration in the capacitive insulating film due to hydrogen. As a result, they reached the following conclusion. That is, although for the above-described known semiconductor device a hydrogen barrier film entirely covers all sides of a ferroelectric capacitor from above, below and around it, a known structure of the semiconductor device in which only a region in which capacitors are formed (hereinafter, referred to as "capacitor formation region") is entirely covered with the hydrogen barrier film allows the capacitive insulating film to have insufficient hydrogen barrier properties.

Furthermore, in order to enclose the capacitors with the hydrogen barrier films, as shown in FIGS. 5 and 6, the hydrogen barrier film is inevitably composed of a plurality of films. Therefore, the hydrogen barrier film is inevitably formed with at least one junction for joining the plurality of films. In addition, the films constituting the hydrogen barrier film are not necessarily made of the same material. Furthermore, in order to enclose the ferroelectric capacitor, the hydrogen barrier film need be formed with at least one junction while being formed with at least one bend. Hydrogen is likely to enter the ferroelectric capacitor from the junction of the hydrogen barrier film. Therefore, the ferroelectric capacitor cannot completely be prevented from being deteriorated due to hydrogen. In particular, when the joined films constituting the hydrogen barrier film are not made of the same material, the deterioration arising from the junction further becomes pronounced. Moreover, the bend causes deterioration in the ferroelectric capacitor due to hydrogen. The reason for this is that, in general, hydrogen is likely to enter into the bend, because the bend has varied film characteristics or is cracked due to the concentration of stress.

The present invention is made in view of the above conventional problem, and its object is to allow a semiconductor device having a capacitive insulating film made of a ferroelectric material or a high-dielectric-constant material to prevent a capacitive insulating film from being deteriorated due to hydrogen during a semiconductor device fabricating process.

The present inventor has found the following in view of the above-mentioned result that the enclosure of only a capacitor formation region within a hydrogen barrier film cannot sufficiently prevent hydrogen from entering into a capacitive insulating film. A first hydrogen barrier film (capacitor hydrogen barrier film) covers all sides of the capacitor formation region and a second hydrogen barrier film (full area hydrogen barrier film) covers the entire area of the semiconductor device including capacitors in at least one of a region of a semiconductor device located above the first hydrogen barrier film and a region thereof located below the capacitors to increase the distance until hydrogen reaches the capacitors, resulting in significantly reduced hydrogen concentration of the capacitor formation region. The present invention is made on the basis of this finding and more specifically, it is realized by the following configuration.

A semiconductor device of the present invention composed at least of a memory circuit part having capacitors and a peripheral circuit part for controlling the memory circuit part, comprises: a first hydrogen barrier film of hydrogen resistance covering a region in which the capacitors are formed; and a second hydrogen barrier film of hydrogen resistance covering at least the memory circuit part and the peripheral circuit part above the first hydrogen barrier film, wherein the second hydrogen barrier film covers a region of the semiconductor device located between an interconnect layer above the first hydrogen barrier film and closest to the capacitors and the first hydrogen barrier film except for a region thereof in which a contact plug is formed.

The semiconductor device of the present invention comprises the first hydrogen barrier film of hydrogen resistance covering the region in which the capacitors are formed and the second hydrogen barrier film covering at least the memory circuit part and the peripheral circuit part above the first hydrogen barrier film. Furthermore, the second hydrogen barrier film covers a region of the semiconductor device located between an interconnect layer above the first hydrogen barrier film and closest to the capacitors and the first hydrogen barrier film except for a region thereof in which at least one contact plug is formed. Therefore, the distance for hydrogen produced during a semiconductor device fabricating process to reach the capacitors becomes very long. This can certainly reduce the amount of hydrogen (hydrogen concentration) reaching the capacitors. Moreover, since the second hydrogen barrier film is formed between the interconnect layer formed above the first hydrogen barrier film covering the capacitors and located closest to the region in which the capacitors are formed and the first hydrogen barrier film, this can restrain hydrogen produced in process steps after the formation of the capacitors from entering into the region in which the capacitors are formed. As a result, the capacitive insulating film constituting a part of the capacitor can be prevented from being deteriorated due to hydrogen.

According to the semiconductor device of the present invention, the first hydrogen barrier film is preferably formed to cover all sides of a region in which the capacitors are formed from above, below and around the region in which the capacitors are formed. This can more certainly prevent the capacitors from being deteriorated due to hydrogen passing through at least one contact hole penetrating the second hydrogen barrier film or hydrogen produced during the formation of an interlayer film, a contact hole and a contact plug formed between the region in which the capacitors are formed and the second hydrogen barrier film.

In this case, the first hydrogen barrier film is preferably formed such that barrier films having different compositions are joined at the lateral sides of the region in which the capacitors are formed. Thus, the capacitors can be enclosed by the first hydrogen barrier film. In addition, materials suitable for semiconductor device fabricating process steps can be selected as respective materials of a lower barrier film covering the lower side of the region in which the capacitors are formed and an upper barrier film covering the upper side and the lateral sides of the region in which the capacitors are formed.

The semiconductor device of the present invention preferably further comprises: an interlayer insulating film which covers the first hydrogen barrier film and through which the contact plug passes; and a third hydrogen barrier film of hydrogen resistance formed on the side surface of the contact plug, wherein the second hydrogen barrier film is formed on the interlayer insulating film, and the third hydrogen barrier film makes contact with the second hydrogen barrier film on the upper end of each said contact plug. This can restrain hydrogen from passing through the contact hole between a diffusion layer or an interconnect located below the second hydrogen and an interconnect located above the second hydrogen barrier film. Furthermore, if the second hydrogen barrier film is formed on the interlayer insulating film in the above-mentioned manner, this provides a planarized film having a small number of bends. Therefore, the hydrogen barrier properties can be kept high with reliability.

The semiconductor device of the present invention preferably further comprises a fourth hydrogen barrier film of hydrogen resistance formed below the capacitors. If the fourth hydrogen barrier film is formed below the capacitors in the above-mentioned manner, this can further prevent hydrogen that has passed through the semiconductor substrate from reaching the capacitors.

In the semiconductor device of the present invention, the fourth hydrogen barrier film preferably makes contact with the third hydrogen barrier film. This can reduce the amount of hydrogen passing through the diffusion layer of the semiconductor substrate located below the second hydrogen barrier film or the contact hole for making electrical contact with an interconnect.

In this case, the third hydrogen barrier film is preferably composed of titanium aluminum, titanium aluminum nitride or a multilayer film of them.

Furthermore, in this case, the third hydrogen barrier film is preferably composed of silicon nitride, silicon oxynitride, aluminum oxide, titanium aluminum oxide, tantalum aluminum oxide, titanium-silicon oxide, or tantalum-silicon oxide. This can prevent a material of an underlayer of each contact plug and a material of the contact plug from being interdiffused and ensure the adhesion therebetween.

In the semiconductor device of the present invention, the interconnect layer preferably includes a conductive material of hydrogen resistance, said conductive material being formed on the second hydrogen barrier film so as to be connected to the contact plug. This can restrain hydrogen from passing through the contact hole between a diffusion layer of the semiconductor substrate or an interconnect located below the second hydrogen barrier film and the interconnect located above the second hydrogen barrier film.

In this case, the conductive material is preferably composed of titanium aluminum, titanium aluminum nitride or a multilayered film of them. This can prevent an underlayer of each contact plug and a material of the contact plug from being interdiffused and ensure the adhesion therebetween.

The semiconductor device of the present invention preferably further comprises an interlayer insulating film which covers the first hydrogen barrier film and through which the contact plug passes through, wherein the second hydrogen barrier film is formed on the interlayer insulating film, the top surface of said interlayer insulating film being planarized. In this way, the second hydrogen barrier film formed on the interlayer insulating film whose top surface is planarized is also planarized, leading to no bend. Therefore, the hydrogen barrier properties can be kept high with reliability.

In the semiconductor device of the present invention, the second hydrogen barrier film is preferably made of silicon nitride, silicon oxynitride, aluminum oxide, titanium aluminum oxide, tantalum aluminum oxide, titanium-silicon oxide, or tantalum-silicon oxide. These materials are typically used for a semiconductor fabricating process. This facilitates taking a countermeasure intended to prevent contamination.

In the semiconductor device of the present invention, it is preferable that the semiconductor device is formed on a semiconductor chip and the second hydrogen barrier film is formed to cover the entire area of the semiconductor chip. Even if the semiconductor device of the present invention is a system LSI equipped with a memory part and a logic part, the coverage of the second hydrogen barrier film over the entire area of the semiconductor chip eliminates the need for patterning the second hydrogen barrier film. This can simplify a semiconductor device fabricating process while keeping the hydrogen barrier properties of each capacitor high.

In the semiconductor device of the present invention, the capacitor preferably has a capacitive insulating film made of a ferroelectric material or a high-dielectric-constant material. Typically, a ferroelectric material or a high-dielectric-constant material is made of a metal oxide and deteriorated in its characteristics due to reduction action arising from hydrogen. Therefore, if the present invention is applied, the effects of the present invention are significant.

BRIEF DESCRIPTION OF THE DRAWINGS

FIGS. 4A through 4C show the semiconductor device according to the present invention, in which

DETAILED DESCRIPTION OF THE INVENTION

Embodiment 1

A first embodiment of the present invention will be described with reference to the drawings.

Figure 1:
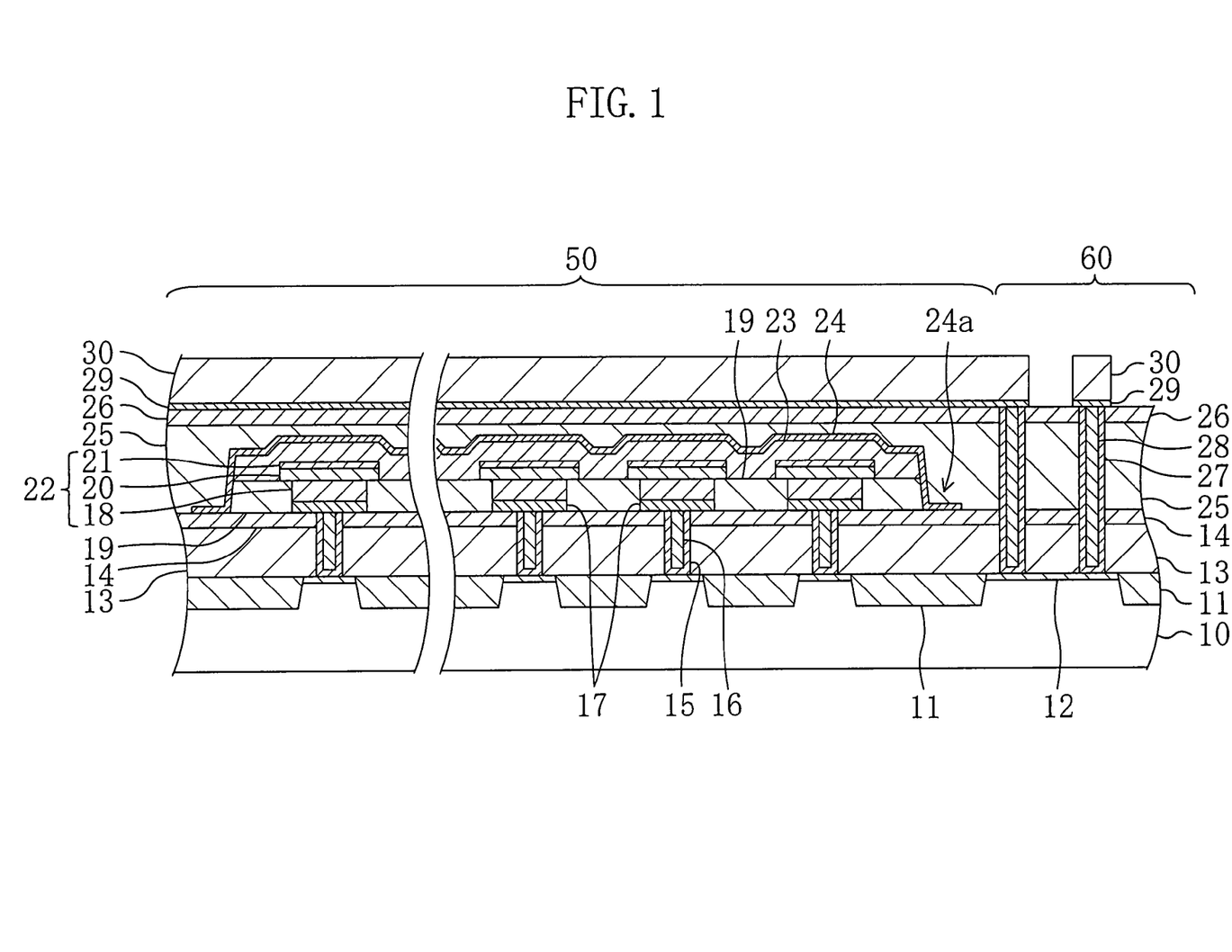
FIG. 1 is a cross-sectional view showing a semiconductor device according to a first embodiment of the present invention and taken along the line I-I in FIG. 4C.

FIG. 1 shows a cross-sectional structure of a semiconductor device according to the first embodiment of the present invention.

As shown in FIG. 1, the principal surface of, for example, a p-type semiconductor substrate 10 is separated into a memory circuit part 50 on which a plurality of memory elements are placed and a peripheral circuit part 60 for controlling writing/reading to/from the memory circuit part 50.

An approximately 300-nm-deep isolation region 11 is selectively formed in the upper part of the semiconductor substrate 10. A plurality of diffusion layers 12 are formed, by ion implantation, in regions into which the semiconductor substrate 10 is sectioned by the isolation region 11.

The top surfaces of the isolation region 11 and the diffusion layers 12 are covered with a first interlayer insulating film 13 made of silicon oxide ($SiO_2$). The first interlayer insulating film 13 is planarized to have a thickness of approximately 500 nm.

A first full area hydrogen barrier film 14 of silicon nitride is formed on the first interlayer insulating film 13 and over the entire area of a chip to have a thickness of approximately 10 nm through 200 nm, preferably, approximately 100 nm. Although in this embodiment silicon nitride ($Si_3N_4$) is used for the first full area hydrogen barrier film 14, a material of the first full area hydrogen barrier film 14 is not restrictive. For example, silicon oxynitride (SiON), aluminum oxide ($Al_2O_3$), titanium aluminum oxide (TiAlO), tantalum aluminum oxide (TaAlO), titanium-silicon oxide (TiSiO), or tantalum-silicon oxide (TaSiO) may be used instead.

In the memory circuit part 50, a plurality of sets of a first contact hydrogen barrier film 15 made of titanium aluminum (TiAl) and titanium aluminum nitride (TiAlN) and a first contact plug 16 filled with tungsten (W) are formed in parts of the first full area hydrogen barrier film 14 and corresponding parts of the first interlayer insulating film 13, respectively, all of which are located on the diffusion layer 12 to make electrical contact with the diffusion layer 12. The first contact hydrogen barrier films 15 are obtained by stacking, in bottom-to-top order, approximately 2- through 20-nm-thick, preferably, approximately 5-nm-thick titanium aluminum (TiAl) and approximately 5- through 50-nm-thick, preferably, approximately 10-nm-thick titanium aluminum nitride (TiAlN). Although a multilayer film of titanium aluminum and aluminum titanium nitride is used for each first contact hydrogen barrier film 15, a material of the first contact hydrogen barrier film 15 is not restrictive. For example, a single-layer film of titanium aluminum or titanium aluminum nitride may be used instead.

An approximately 10- through 200-nm-thick, preferably approximately 100-nm-thick first conductive hydrogen barrier film 17 of titanium aluminum nitride is selectively formed on the first full area hydrogen barrier film 14 to cover each first contact plug 16. Its middle part is connected to each first contact plug 16, and its edge part is connected to the first full area hydrogen barrier film 14. Although titanium aluminum nitride is used for the first conductive hydrogen barrier film 17, a material of the first conductive hydrogen barrier film 17 is not restrictive. For example, titanium aluminum or a multilayer film of titanium aluminum and titanium aluminum nitride may be used instead.

A lower electrode 18 of approximately 50-nm-thick iridium (Ir), approximately 50-nm-thick iridium oxide ($IrO_2$) and approximately 50-nm-thick platinum (Pt) is formed on the first conductive hydrogen barrier film 17 to have the same shape as the first conductive hydrogen barrier film 17.

The lower electrode 18 is covered with a planarized second interlayer insulating film 19 of silicon oxide with only its top surface uncovered. An approximately 100-nm-thick, ferroelectric capacitive insulating film 20 of a bismuth-layered-perovskite-type oxide having as the main components strontium (Sr), bismuth (Bi), tantalum (Ta), and niobium (Nb) is formed on the lower electrode 18 and the second interlayer insulating film 19 to cover the lower electrode 18. A material of the capacitive insulating film 20 is not limited to a ferroelectric material of the above-described composition. A ferroelectric material made of an oxide having, as the main components, components selected from the group of the above-described main components, lead (Pb), zirconium (Zr), titanium (Ti), barium (Ba), and lanthanum (La) can be used instead. Furthermore, the material of the capacitive insulating film 20 is not limited to a ferroelectric material. A high-dielectric-constant material, such as tantalum pentoxide ($Ta_2O_5$), may be used instead.

An approximately 50-nm-thick upper electrode 21 of platinum is formed on the capacitive insulating film 20 to have the same shape as the capacitive insulating film 20. A capacitor 22 is composed of the lower electrode 18, the capacitive insulating film 20 and the upper electrode 21.

The capacitive insulating films 20 and the upper electrodes 21 are covered with a third interlayer insulating film 23 made of silicon oxide. Parts of the third interlayer insulating film 23 and the second interlayer insulating film 19 located outside a region in which the capacitors 22 are formed (hereinafter, referred to as "capacitor formation region") are removed to partly expose the first full area hydrogen barrier film 14. Respective exposed surfaces of the third interlayer insulating film 23, the second interlayer insulating film 19 and the first full area hydrogen barrier film 14 are covered with an approximately 10- through 200-nm-thick, preferably approximately 20-nm-thick capacitor hydrogen barrier film 24 made of titanium aluminum oxide. A part of the capacitor hydrogen barrier film 24 located outside the edge surfaces of the third interlayer insulating film 23 and the second interlayer insulating film 19 is removed to partly expose the first full area hydrogen barrier film 14.

The edge of the capacitor hydrogen barrier film 24 has a junction 24a with the first full area hydrogen barrier film 14. The capacitor hydrogen barrier film 24 preferably covers the capacitors 22 in units of cell plates or blocks each including a plurality of cell plates. Although titanium aluminum oxide is used for the capacitor hydrogen barrier film 24, a material of the capacitor hydrogen barrier film 24 is not restrictive. For example, silicon nitride, silicon oxynitride, aluminum oxide, tantalum aluminum oxide, titanium-silicon oxide, or tantalum-silicon oxide may be used instead.

The capacitor hydrogen barrier film 24 and an exposed part of the first full area hydrogen barrier film 14 are covered with a fourth interlayer insulating film 25 made of silicon oxide. The fourth interlayer insulating film 25 is planarized such that a part of the fourth interlayer insulating film 25 formed on a part of the capacitor hydrogen barrier film 24 located above each capacitor 22 has a thickness of about 200 nm. An approximately 10- through 200-nm-thick, preferably approximately 100-nm-thick second full area hydrogen barrier film 26 is formed on the fourth interlayer insulating film 25 and over the chip. Although silicon nitride is used for the second full area hydrogen barrier film 26, a material of the second full area hydrogen barrier film 26 is not restrictive. For example, silicon oxynitride, aluminum oxide, titanium aluminum oxide, tantalum aluminum oxide, titanium-silicon oxide, or tantalum-silicon oxide may be used instead.

For the peripheral circuit part 60, a second contact hydrogen barrier film 27 made of titanium aluminum and titanium aluminum nitride and a second contact plug 28 filled with tungsten are formed in parts of the second full area hydrogen barrier film 26, the fourth interlayer insulating film 25, the first full area hydrogen barrier film 14, and the first interlayer insulating film 13 located outside the capacitor formation region, i.e., outside the capacitor hydrogen barrier film 24, to make electrical contact with the diffusion layer 12 of the semiconductor substrate 10. The second contact hydrogen barrier film 27 is obtained by stacking, in bottom-to-top order, approximately 2- through 20-nm-thick, preferably approximately 5-nm-thick titanium aluminum and approximately 5- through 50-nm-thick, preferably approximately 10-nm-thick titanium aluminum nitride. Although a multilayer film of titanium aluminum and aluminum titanium nitride is used for the second contact hydrogen barrier film 27, a material of the second contact hydrogen barrier film 27 is not restrictive. For example, a single-layer film of titanium aluminum or titanium aluminum nitride may be used instead.

A second conductive hydrogen barrier film 29 obtained by stacking, in bottom-to-top order, approximately 2- through 20-nm-thick, preferably approximately 5-nm-thick titanium aluminum and approximately 10- through 200-nm-thick, preferably approximately 50-nm-thick titanium aluminum nitride is selectively formed on the second full area hydrogen barrier film 26 to cover the second contact hydrogen barrier film 27 and the second contact plug 28. The second conductive hydrogen barrier film 29 makes electrical contact with not only the second contact hydrogen barrier film 27 and the second contact plug 28 but also the second full area hydrogen barrier film 26. Although a multilayer film of titanium aluminum and titanium aluminum nitride is used for the second conductive hydrogen barrier film 29, a material of the second conductive hydrogen barrier film 29 is not restrictive. For example, a single-layer film of titanium aluminum or titanium aluminum nitride may be used instead.

An interconnect 30 obtained by stacking approximately 500-nm-thick aluminum (Al) and approximately 50-nm-thick titanium nitride (TiN) in bottom-to-top order is formed on the second conductive hydrogen barrier film 29 to have the same shape as the second conductive hydrogen barrier film 29 and electrically connected to the diffusion layer 12 through the second contact plug 28 and the second contact hydrogen barrier film 27.

Although not shown, other interlayer insulating films and interconnects are formed on a combination of the interconnect 30 and the second conductive hydrogen barrier film 29 to constitute a multilayer interconnect.

According to the first embodiment, the capacitors 22 are formed to enclose the capacitor formation region within the first full area hydrogen barrier film 14 and the capacitor hydrogen barrier film 24. Furthermore, the planarized second full area hydrogen barrier film 26 covers a substrate region above the capacitor hydrogen barrier film 24. The second full area hydrogen barrier film 26 is formed over a semiconductor substrate 10 region, i.e., a semiconductor chip region, without being patterned. Thus, a path through which hydrogen produced during the fabrication of a semiconductor device reaches the capacitors 22 becomes much longer than that in the case where the capacitor formation region is covered with only the first full area hydrogen barrier film 14 and the capacitor hydrogen barrier film 24. This sharply reduces the amount of hydrogen reaching the capacitive insulating film 20 constituting a part of each capacitor 22. As a result, the capacitive insulating film 20 can be prevented from being deteriorated in its characteristics due to hydrogen. More particularly, since hydrogen must make a detour from the edges of the first full area hydrogen barrier film 14 and the second full area hydrogen barrier film 26 located at the edge of the peripheral circuit part 60 and then diffuse into the capacitors 22, the distance for hydrogen to reach the capacitors 22 located inside the memory circuit part 50 becomes very long. Therefore, hydrogen entering the memory circuit part 50 from the outside of each full area hydrogen barrier film can be reduced in concentration.

In the first embodiment, the first full area hydrogen barrier film 14 functions as a lower capacitor hydrogen barrier film within a range surrounded by the junction between the first full area hydrogen barrier film 14 and the capacitor hydrogen barrier film 24.

Since the first contact hydrogen barrier film 15 is formed on the side surface of each first contact plug 16 and the second contact hydrogen barrier film 27 is formed on the side surface of each second contact plug 28, hydrogen can certainly be restrained from passing through contact holes.

Furthermore, since the first conductive hydrogen barrier films 17 are formed between the first contact plugs 16 and the lower electrodes 18 and the second conductive hydrogen barrier film 29 is formed between the second contact plug 28 and the interconnect 30, hydrogen can certainly be restrained from passing through the contact holes.

Materials of the first contact hydrogen barrier films 15 and the second contact hydrogen barrier films 27 are not limited to a conductive material. An insulating material, such as silicon nitride, silicon oxynitride, aluminum oxide, titanium aluminum oxide, tantalum aluminum oxide, titanium-silicon oxide, or tantalum-silicon oxide, can be used instead. In this relation, when such an insulating material is used, parts of the first contact hydrogen barrier films 15 and the second contact hydrogen barrier films 27 located at the bottoms of the contact holes need be removed.

The capacitor hydrogen barrier film corresponds to a first hydrogen barrier film of the present invention. The second full area hydrogen barrier film corresponds to a second hydrogen barrier film of the present invention. The second contact hydrogen barrier film corresponds to a third hydrogen barrier film of the present invention. The first full area hydrogen barrier film corresponds to a fourth hydrogen barrier film of the present invention.

Embodiment 2

A second embodiment of the present invention will be described hereinafter with reference to the drawings.

Figure 2:
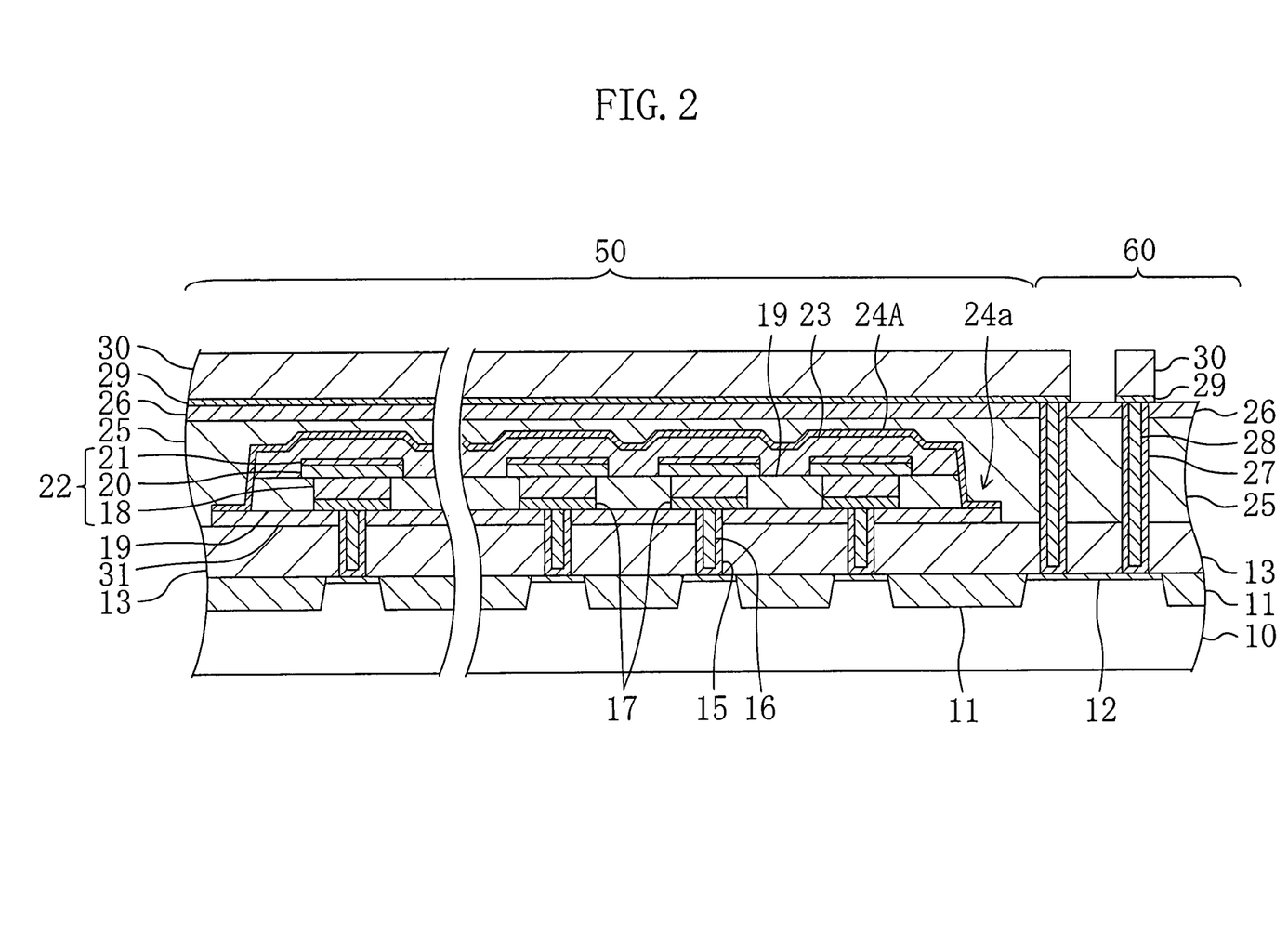
FIG. 2 is a cross-sectional view showing a semiconductor device according to a second embodiment of the present invention.

FIG. 2 shows a cross-sectional structure of a semiconductor device according to the second embodiment of the present invention. Parts of the second embodiment different from the first embodiment will be described. As shown in FIG. 2, for the semiconductor device of the second embodiment, the first full area hydrogen barrier film 14 of the first embodiment is replaced with a first capacitor hydrogen barrier film 31 covering only a part of a substrate region under a capacitor formation region. To be specific, an approximately 10- through 200-nm-thick, preferably approximately 100-nm-thick first capacitor hydrogen barrier film 31 made of silicon nitride is formed only on a part of a first interlayer insulating film 13 located under the capacitor formation region. Although in the second embodiment silicon nitride is used for the first capacitor hydrogen barrier film 31, a material of the first capacitor hydrogen barrier film 31 is not restrictive. For example, silicon oxynitride, aluminum oxide, titanium aluminum oxide, tantalum aluminum oxide, titanium-silicon oxide, or tantalum-silicon oxide may be used instead.

Respective exposed surfaces of a third interlayer insulating film 23, a second interlayer insulating film 19, the first capacitor hydrogen barrier film 31, and a first interlayer insulating film 13 are covered with an approximately 10- through 200-nm-thick, preferably approximately 20-nm-thick second capacitor hydrogen barrier film 24A made of titanium aluminum oxide. A part of the second capacitor hydrogen barrier film 24A extending beyond the edges of the third interlayer insulating film 23 and the second interlayer insulating film 19 is partly removed to expose the first interlayer insulating film 13. Furthermore, the edge of the second capacitor hydrogen barrier film 24A has a junction 24a with a peripheral part of the first capacitor hydrogen barrier film 31. Although titanium aluminum oxide is used for the second capacitor hydrogen barrier film 24A, a material of the second capacitor hydrogen barrier film 24A is not restrictive. For example, silicon nitride, silicon oxynitride, aluminum oxide, tantalum aluminum oxide, titanium-silicon oxide, or tantalum-silicon oxide may be used instead.

According to the second embodiment, since the first capacitor hydrogen barrier film 31 does not cover the entire semiconductor substrate 10 region, hydrogen passing through the semiconductor substrate 10 reaches the junction 24a between the first capacitor hydrogen barrier film 31 and the second capacitor hydrogen barrier film 24A and a bend of the second capacitor hydrogen barrier film 24A. Thus, the hydrogen barrier properties of the capacitive insulating film 20 are deteriorated a little as compared with those in the first embodiment. On the other hand, since there does not exist, between the first interlayer insulating film 13 and the fourth interlayer insulating film 25, any hydrogen barrier film having a different composition from that of each of the films 13 and 25, this facilitates etching in a dry etching process of forming contact holes for the formation of the second contact plugs 28. In addition, the number of choices of etching conditions and film types is increased. For example, the second full area hydrogen barrier film 26, the fourth interlayer insulating film 25, and the first interlayer insulating film 13 are formed of films having silicon (Si) as the main component. Thereafter, etching is performed by an apparatus using a fluorine (F) component gas on the conditions suitable for the fluorine (F) component gas until a diffusion layer 12 of the semiconductor substrate 10 is exposed. Since there does not exist, between the fourth interlayer insulating film 25 and the first interlayer insulating film 13, any insulating film having a different composition from that of each of the films 25 and 13, this prevents the number of process steps from increasing due to the change in etching apparatuses and avoids the influence of etching products. Furthermore, since notches or the like are not formed in contact holes, the second capacitor hydrogen barrier film 24A is less likely to partly be removed at the bend. Most of hydrogen is kept out by the second full area hydrogen barrier film 26. This more significantly improves the characteristics of the capacitive insulating film 20 than in the case where the capacitors 22 are surrounded by only the first full area hydrogen barrier film 31 and the second capacitor hydrogen barrier film 24A.

The first capacitor hydrogen barrier film 31 of the second embodiment corresponds to a first hydrogen barrier film or a fourth hydrogen barrier film of the present invention.

Embodiment 3

A third embodiment of the present invention will be described hereinafter with reference to the drawings.

Figure 3:
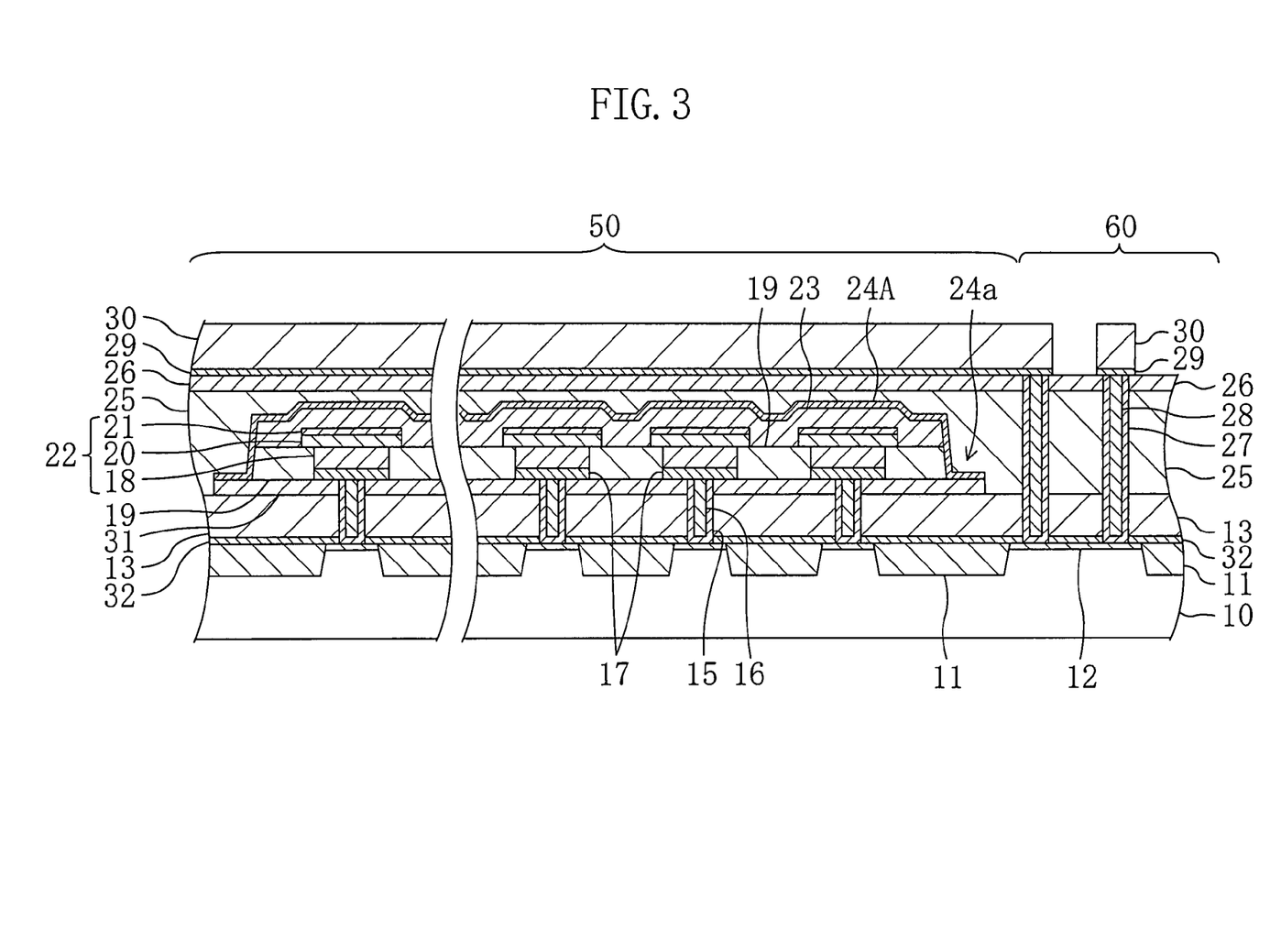
FIG. 3 is a cross-sectional view showing a semiconductor device according to a third embodiment of the present invention.

FIG. 3 shows a cross-sectional structure of a semiconductor device according to the third embodiment of the present invention. For the semiconductor device of the third embodiment, hydrogen from a substrate side is prevented from deteriorating the capacitive insulating film 20 of the semiconductor device of the second embodiment. More particularly, a capacitor formation region is surrounded by a first hydrogen barrier film, and a part of a substrate region outside the capacitor formation region is also surrounded by a second hydrogen barrier film and a fourth hydrogen barrier film.

Parts of the third embodiment different from the second embodiment will be described.

As shown in FIG. 3, an approximately 10- through 200-nm-thick, preferably approximately 20-nm-thick first full area hydrogen barrier film 32 of titanium aluminum oxide is formed on an isolation region 11 and a diffusion layer 12 both located in the principal surface of a semiconductor substrate 10 and over the entire area of a chip region. Although in the third embodiment titanium aluminum oxide is used for the first full area hydrogen barrier film 32, a material of the first full area hydrogen barrier film 32 is not restrictive. For example, silicon nitride, silicon oxynitride, aluminum oxide, tantalum aluminum oxide, titanium-silicon oxide, or tantalum-silicon oxide may be used instead.

According to the third embodiment, since the first full area hydrogen barrier film 32 is formed on the entire principal surface of the semiconductor substrate 10, this can prevent hydrogen from deteriorating the capacitive insulating film 20. Furthermore, since there does not exist, between a first interlayer insulating film 13 and a fourth interlayer insulating film 25, any hydrogen barrier film having a different composition from that of each of the films 13 and 25, this facilitates etching in a dry etching process of forming contact holes for the formation of second contact plugs 28. In addition, the number of choices of etching conditions and film types is increased. For example, a second full area hydrogen barrier film 26, the fourth interlayer insulating film 25, and the first interlayer insulating film 13 are formed of films having silicon (Si) as the main component, and the first full area hydrogen barrier film 32 is formed of a film having titanium or aluminum as the main component. Thereafter, etching is performed by an apparatus using a fluorine (F) component gas on the conditions suitable for the fluorine (F) component gas until the first full area hydrogen barrier film 32 is exposed. Subsequently, the first full area hydrogen barrier film 32 is partly etched by an apparatus using a chlorine (Cl) component gas on the conditions suitable for the chlorine (Cl) component gas until the diffusion layer 12 is exposed. Since there does not exist, between the fourth interlayer insulating film 25 and the first interlayer insulating film 13, any insulating film having a different composition from that of each of the films 25 and 13, this prevents the number of process steps from increasing due to the change in etching apparatuses and avoids the influence of etching products.

In the third embodiment, the second full area hydrogen barrier film 26 is preferably connected to a seal ring formed around the semiconductor chip (semiconductor substrate) 10. Furthermore, a hydrogen barrier film with hydrogen resistance may be formed on the inner wall of a groove with which the seal ring is formed. If the hydrogen barrier film is thus formed on the side surface of the seal ring, this can effectively prevent hydrogen from entering the inside of the memory circuit part 50 or the peripheral circuit part 60 from the outside of the seal ring.

More specifically, the formation of the first full area hydrogen barrier film 32 prevents hydrogen passing through the semiconductor substrate 10 from entering the capacitors 22 from below. The formation of the second full area hydrogen barrier film 26 and the second contact hydrogen barrier film 27 prevents hydrogen from entering the capacitors 22 from above. Furthermore, the formation of the hydrogen barrier film on the seal ring prevents hydrogen from entering the capacitors 22 from the lateral sides of the semiconductor chip 10. Therefore, hydrogen produced in an interconnect formation process step after a capacitor formation process step can more effectively be prevented from entering the capacitors.

The structure of a semiconductor device obtained by combining the semiconductor device of the third embodiment with the semiconductor device of the first embodiment is also possible.

A description will be given of the structure of the semiconductor device according to any one of the first through third embodiments of the present invention at the wafer level with reference to the drawings.

Figure 4A:
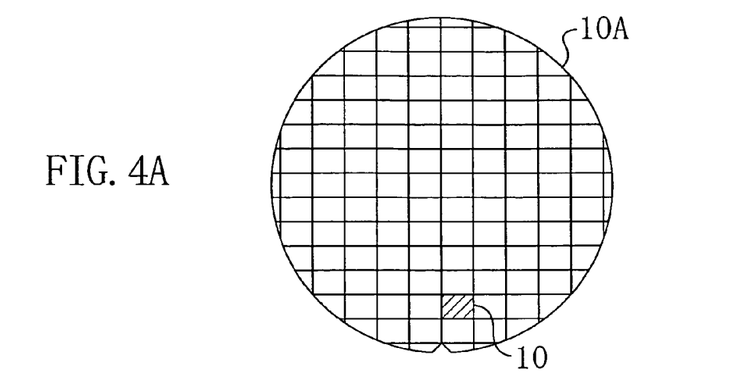
FIG. 4A is a plan view showing the semiconductor device at the wafer level.
Figure 4B:
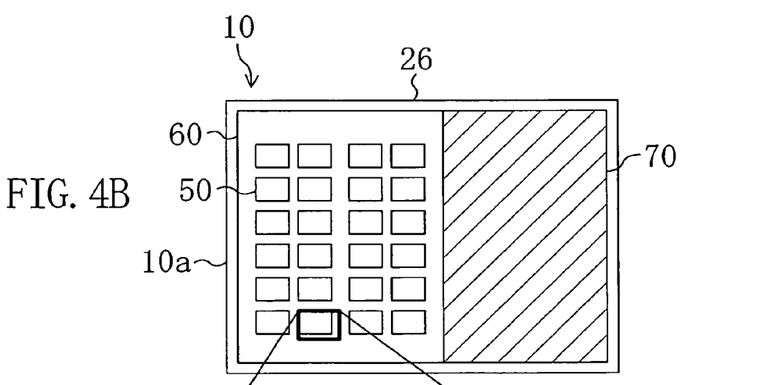
FIG. 4B is a plan view showing the semiconductor device at the chip level.
Figure 4C:
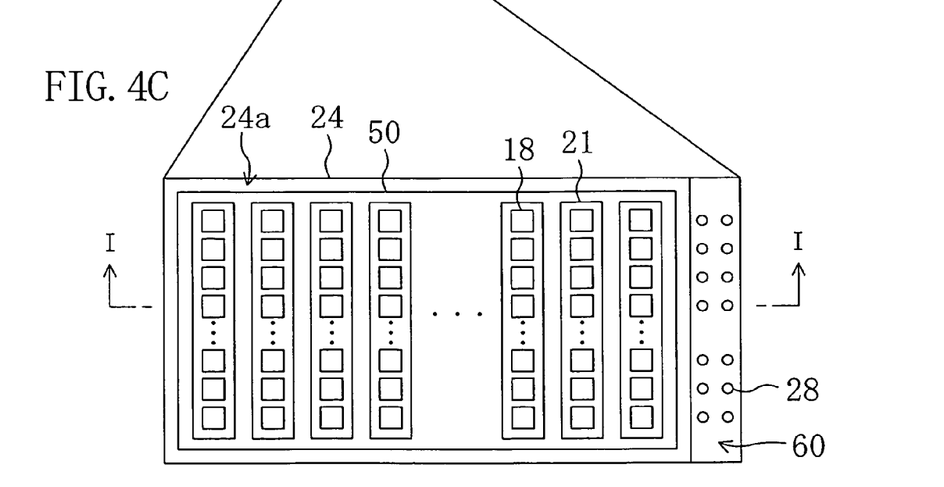
FIG. 4C is an enlarged plan view partly showing a memory circuit part and a peripheral circuit part of a semiconductor chip.

FIG. 4A shows a plan structure of a semiconductor device at the wafer level, FIG. 4B shows an enlarged plan structure of a region in which a chip is formed, and FIG. 4C shows a plan structure of a memory circuit part and a peripheral circuit part. FIG. 1 is a cross-sectional view taken along the line I-I in FIG. 4C.

As shown in FIG. 4B, not only memory circuit parts 50 and a peripheral circuit part 60 but also another circuit part 70 including, for example, a logic circuit, an analog circuit, or a static random access memory (SRAM) circuit are formed on a semiconductor chip 10. A second full area hydrogen barrier film 26 covers the entire area of the semiconductor chip 10 including the entire area of a scribe region 10a obtained by sectioning a semiconductor wafer 10A into semiconductor chips 10.

As shown in FIG. 4C, for example, a capacitor hydrogen barrier film 24 has a junction 24a located in a peripheral region of each memory circuit part 50 and joined with a first full area hydrogen barrier film 14 and covers only the memory circuit part 50. Furthermore, as described above, the first capacitor hydrogen barrier film 31 of the second or third embodiment is formed only in the memory circuit part 50.

The first full area hydrogen barrier films 14 and 32 and the second full area hydrogen barrier film 26 are formed, without being patterned, on the entire area of the semiconductor chip 10 region except for regions in which contact plugs are formed. Even if the first full area hydrogen barrier films 14 and 32 and the second full area hydrogen barrier film 26 are formed to cover at least a circuit part of the semiconductor device including the memory circuit parts 50 having capacitors 22 and a peripheral circuit part 60 for controlling the memory circuit parts 50, the effects of the present invention can be obtained.

In this way, the semiconductor device of the present invention is characterized in that a hydrogen barrier film (14, 26, 32) is formed, for example, between an interconnect layer that is the lowest layer of multilayer interconnects constituting the peripheral circuit part 60 and capacitors 22 constituting each memory circuit part 50, to cover the entire area of the semiconductor chip 10 region. Thus, the distance over which hydrogen produced in the interconnect formation process step after the formation of the capacitors is diffused to reach the capacitors 22 becomes long. This can prevent the capacitive insulating film 20 located in a capacitor formation region from being reduced by hydrogen.

As described above, the semiconductor device of the present invention can restrain the capacitive insulating film constituting each capacitor from being deteriorated due to hydrogen and is useful for a semiconductor device or the like using a ferroelectric material or a high-dielectric-constant material for a capacitive insulating film.

What is claimed is:

1. A semiconductor device composed at least of a memory circuit part having capacitors and a peripheral circuit part for controlling the memory circuit part, said semiconductor device comprising:
   a first hydrogen barrier film of hydrogen resistance covering a region in which the capacitors are formed; and
   a second hydrogen barrier film of hydrogen resistance covering at least the memory circuit part and the peripheral circuit part above the first hydrogen barrier film,
   wherein the second hydrogen barrier film covers a region of the semiconductor device located between an interconnect layer above the first hydrogen barrier film and closest to the capacitors and the first hydrogen barrier film except for a region thereof in which a contact plug is formed, and
   the first hydrogen barrier film is formed to cover all sides of a region in which the capacitors are formed from above, below and around the region in which the capacitors are formed.

2. The semiconductor device of claim 1, wherein
   the first hydrogen barrier film is formed such that barrier films having different compositions are joined at the lateral sides of the region in which the capacitors are formed.

3. The semiconductor device of claim 1, further comprising:

an interlayer insulating film which covers the first hydrogen barrier film and through which the contact plug passes; and a third hydrogen barrier film of hydrogen resistance formed on the side surface of the contact plug, wherein the second hydrogen barrier film is formed on the interlayer insulating film, and the third hydrogen barrier film makes contact with the second hydrogen barrier film on the upper end of each said contact plug.

4. The semiconductor device of claim 3, further comprising a fourth hydrogen barrier film of hydrogen resistance formed below the capacitors.

5. The semiconductor device of claim 4, wherein the fourth hydrogen barrier film makes contact with the third hydrogen barrier film.

6. The semiconductor device of claim 3, wherein the third hydrogen barrier film is composed of titanium aluminum, titanium aluminum nitride or a multilayer film of them.

7. The semiconductor device of claim 3, wherein the third hydrogen barrier film is composed of silicon nitride, silicon oxynitride, aluminum oxide, titanium aluminum oxide, tantalum aluminum oxide, titanium-silicon oxide, or tantalum-silicon oxide.

8. The semiconductor device of claim 1, wherein the interconnect layer includes a conductive material of hydrogen resistance, said conductive material being formed on the second hydrogen barrier film so as to be connected to the contact plug.

9. The semiconductor device of claim 8, wherein the conductive material is composed of titanium aluminum, titanium aluminum nitride or a multilayered film of them.

10. The semiconductor device of claim 1 further comprising an interlayer insulating film which covers the first hydrogen barrier film and through which the contact plug passes through, wherein the second hydrogen barrier film is formed on the interlayer insulating film, the top surface of said interlayer insulating film being planarized.

11. The semiconductor device of claim 1, wherein the second hydrogen barrier film is made of silicon nitride, silicon oxynitride, aluminum oxide, titanium aluminum oxide, tantalum aluminum oxide, titanium-silicon oxide, or tantalum-silicon oxide.

12. The semiconductor device of claim 1, wherein the semiconductor device is formed on a semiconductor chip, and the second hydrogen barrier film is formed to cover the entire area of the semiconductor chip.

13. The semiconductor device of claim 1, wherein the capacitor has a capacitive insulating film made of a ferroelectric material or a high-dielectric-constant material.

14. A semiconductor device composed at least of a memory circuit part having capacitors and a peripheral circuit part for controlling the memory circuit part, said semiconductor device comprising:

a first hydrogen barrier film of hydrogen resistance covering a region in which the capacitors are formed; and a second hydrogen barrier film of hydrogen resistance covering at least the memory circuit part and the peripheral circuit part above the first hydrogen barrier film, wherein the second hydrogen barrier film covers a region of the semiconductor device located between an interconnect layer above the first hydrogen barrier film and closest to the capacitors and the first hydrogen barrier film except for a region thereof in which a contact plug is formed, the first hydrogen barrier film is formed to cover all sides of a region in which the capacitors are formed from above, below and around the region in which the capacitors are formed, and the first hydrogen barrier film is formed such that barrier films having different compositions are joined at the lateral sides of the region in which the capacitors are formed.

15. The semiconductor device of claim 14, wherein the interconnect layer includes a conductive material of hydrogen resistance, said conductive material being formed on the second hydrogen barrier film so as to be connected to the contact plug.

16. The semiconductor device of claim 15, wherein the conductive material is composed of titanium aluminum, titanium aluminum nitride or a multilayered film of the foregoing materials.

17. The semiconductor device of claim 14 further comprising an interlayer insulating film which covers the first hydrogen barrier film and through which the contact plug passes through, wherein the second hydrogen barrier film is formed on the interlayer insulating film, the top surface of said interlayer insulating film being planarized.

18. The semiconductor device of claim 14, wherein the second hydrogen barrier film is made of silicon nitride, silicon oxynitride, aluminum oxide, titanium aluminum oxide, tantalum aluminum oxide, titanium-silicon oxide, or tantalum-silicon oxide.

19. The semiconductor device of claim 14, wherein the semiconductor device is formed on a semiconductor chip, and the second hydrogen barrier film is formed to cover the entire area of the semiconductor chip.

20. The semiconductor device of claim 14, wherein the capacitor has a capacitive insulating film made of a ferroelectric material or a high-dielectric-constant material.

21. A semiconductor device composed at least of a memory circuit part having capacitors and a peripheral circuit part for controlling the memory circuit part, said semiconductor device comprising:

a first hydrogen barrier film of hydrogen resistance covering a region in which the capacitors are formed; and a second hydrogen barrier film of hydrogen resistance covering at least the memory circuit part and the peripheral circuit part above the first hydrogen barrier film, an interlayer insulating film which covers the first hydrogen barrier film and through which the contact plug passes;

a third hydrogen barrier film of hydrogen resistance formed on the side surface of the contact plug; and a fourth hydrogen barrier film of hydrogen resistance formed below the capacitors, wherein the second hydrogen barrier film covers a region of the semiconductor device located between an interconnect layer above the first hydrogen barrier film and closest to the capacitors and the first hydrogen barrier film except for a region thereof in which a contact plug is formed, the second hydrogen barrier film is formed on the interlayer insulating film, the third hydrogen barrier film makes contact with the second hydrogen barrier film on the upper end of each said contact plug, and the fourth hydrogen barrier film makes contact with the third hydrogen barrier film.

22. The semiconductor device of claim 21, wherein the third hydrogen barrier film is composed of titanium aluminum, titanium aluminum nitride or a multilayer film of them.

23. The semiconductor device of claim 21, wherein the third hydrogen barrier film is composed of silicon nitride, silicon oxynitride, aluminum oxide, titanium aluminum oxide, tantalum aluminum oxide, titanium-silicon oxide, or tantalum-silicon oxide.

24. The semiconductor device of claim 21, wherein the interconnect layer includes a conductive material of hydrogen resistance, said conductive material being formed on the second hydrogen barrier film so as to be connected to the contact plug.

25. The semiconductor device of claim 24, wherein the conductive material is composed of titanium aluminum, titanium aluminum nitride or a multilayered film of the foregoing materials.

26. The semiconductor device of claim 21 further comprising an interlayer insulating film which covers the first hydrogen barrier film and through which the contact plug passes through, wherein the second hydrogen barrier film is formed on the interlayer insulating film, the top surface of said interlayer insulating film being planarized.

27. The semiconductor device of claim 21, wherein the second hydrogen barrier film is made of silicon nitride, silicon oxynitride, aluminum oxide, titanium aluminum oxide, tantalum aluminum oxide, titanium-silicon oxide, or tantalum-silicon oxide.

28. The semiconductor device of claim 21, wherein the semiconductor device is formed on a semiconductor chip, and the second hydrogen barrier film is formed to cover the entire area of the semiconductor chip.

29. The semiconductor device of claim 21, wherein the capacitor has a capacitive insulating film made of a ferroelectric material or a high-dielectric-constant material.

* * * * *